(12) United States Patent
Kris

(10) Patent No.: US 9,337,811 B1
(45) Date of Patent: May 10, 2016

(54) ASYMMETRIC HYSTERETIC CONTROLLERS

(71) Applicant: Microchip Technology Incorporated, Chandler, AZ (US)

(72) Inventor: Bryan Kris, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/538,068

(22) Filed: Nov. 11, 2014

(51) Int. Cl.
*H03K 3/017* (2006.01)
*H03K 3/0233* (2006.01)

(52) U.S. Cl.
CPC ............ *H03K 3/017* (2013.01); *H03K 3/02337* (2013.01)

(58) Field of Classification Search
USPC .................................. 327/134, 170–175, 205
See application file for complete search history.

(56) References Cited

U.S. PATENT DOCUMENTS

| | | | |
|---|---|---|---|
| 3,689,914 A | 9/1972 | Butler | 341/147 |
| 4,646,321 A | 2/1987 | Berlinsky | 375/238 |
| 5,525,874 A | 6/1996 | Mallarapu et al. | 318/400.13 |
| 6,281,822 B1 | 8/2001 | Park | 341/144 |
| 6,317,067 B1 | 11/2001 | Mohindra | 341/145 |
| 6,459,398 B1 | 10/2002 | Gureshnik et al. | 341/144 |
| 6,489,909 B2 | 12/2002 | Nakao et al. | 341/144 |
| 6,606,044 B2 | 8/2003 | Roeckner et al. | 341/143 |
| 9,048,863 B2 | 6/2015 | Kris et al. | |
| 2006/0197720 A1 | 9/2006 | De Oto et al. | 345/46 |
| 2006/0233234 A1 | 10/2006 | Lim | 375/239 |
| 2008/0180299 A1 | 7/2008 | Forejt | 341/166 |
| 2008/0309534 A1 | 12/2008 | Baker | 341/143 |
| 2011/0050467 A1 | 3/2011 | Crespi et al. | 341/50 |
| 2011/0102486 A1 | 5/2011 | Tabata et al. | 347/10 |
| 2012/0176824 A1 | 7/2012 | Franklin et al. | 363/79 |
| 2013/0293401 A1 | 11/2013 | Werking | 341/120 |
| 2014/0266833 A1 | 9/2014 | Kris et al. | 341/144 |

FOREIGN PATENT DOCUMENTS

| | | | |
|---|---|---|---|
| EP | 2299577 A1 | 3/2011 | H02M 3/156 |
| WO | 00/01075 A1 | 1/2000 | H03M 7/32 |

OTHER PUBLICATIONS

International Search Report and Written Opinion, Application No. PCT/US2014/023049, 10 pages, Oct. 6, 2014.
U.S. Non-Final Office Action, U.S. Appl. No. 14/538,036, 12 pages, Sep. 22, 2015.
International Search Report and Written Opinion, Application No. PCT/US2015/059665, 12 pages, Feb. 12, 2016.

(Continued)

*Primary Examiner* — An Luu
(74) *Attorney, Agent, or Firm* — Slayden Grubert Beard PLLC

(57) ABSTRACT

An asymmetric hysteretic controller comprises an analog comparator coupled with a fast slew rate DAC, or a digital comparator coupled with an ADC plus some digital control logic. The comparator, analog or digital, operates as a sequential windowed comparator having high and low limits. The sense parameter is compared to a high or a low limit and when the sense parameter reaches the selected high or low limit, the controlled device is turned off or on, respectively. When the hysteretic controller state comparison reversal occurs: (a) the comparator output may be blanked by the control logic, (b) the comparator polarity may be reversed by the control logic, (c) the control logic may command the other process limit to be selected for comparison with the sense parameter, and (d) then the comparator output may be re-enabled.

25 Claims, 6 Drawing Sheets

(56) References Cited

OTHER PUBLICATIONS

"Section 48. Comparator with Blanking," PIC24F Family Reference Manual, Microchip Technology Incorporated, 30 pages, Dec. 1, 2010.

"Comparator with Blanking and Filtering on the dsPIC DSC," Microchip Technology Incorporated, 14 pages, Dec. 31, 2011.

"High-Speed Analog Comparator Module," dsPIC33E/PIC24E Family Reference Manual, Microchip Technology Incorporated, 16 pages, Sep. 1, 2014.

International Search Report and Written Opinion, Application No. PCT/US2015/059676, 17 pages, Mar. 1, 2016.

ASYMMETRIC HYSTERETIC CONTROLLERS

TECHNICAL FIELD

The present disclosure relates to hysteretic control, and, more particularly, to hysteretic control using a sequential window comparator.

BACKGROUND

In hysteretic control a sense parameter, e.g., voltage, current, temperature, pressure, relative humidity etc., cycles between first and second thresholds, e.g., upper/lower and lower/upper thresholds. There is no error amplifier or complex pole-zero filters used or needed. Hysteretic control is sometimes called "Bang-Bang" control where the system alternates between two states, e.g., on or off, high or low, hot or cold, fast or slow, up or down, right or left, clockwise or counterclockwise, etc. Hysteretic control turns on/off a controlled device when the sense parameter is less than the first threshold and turns off/on the controlled device when the sense parameter is greater than the second threshold, e.g., thermostat and heating/cooling system. Switching frequency may vary with changing loads and operating conditions, e.g., temperature.

Simple hysteretic control may use a single hysteretic analog comparator. Advanced asymmetric hysteretic control methods may support adaptive behavior, e.g., adjusting for changing loads, maintaining efficiency over changing conditions, etc. Asymmetric hysteretic control requires two references, e.g., digital-to-analog converters (DACs) and two comparators for independent first and second thresholds. Timers may also be required to provide for frequency control. These components result in significantly more expensive hysteretic control.

SUMMARY

Therefore, a need exists for a simple and less expensive hysteretic control that may be implemented with a single comparator and a fast slew rate digital-to-analog converter (DAC) or analog-to-digital converter (ADC). Wherein the fast slew rate DAC or ADC, and comparator function as a "sequential window comparator."

According to an embodiment, a method for hysteretic control of a pulse width modulation (PWM) generator may comprise the steps of: monitoring an output of a PWM generator; determining when the output of the PWM generator may change from a low to a high level; starting a blanking timer when the output of the PWM generator may change from the low to the high level; selecting a high limit value from a high limit register as an input to a digital-to-analog converter (DAC); determining when the blanking timer may have timed out; enabling an output of a comparator when the blanking timer may have timed out for indicating a comparison of an output of the DAC that may represent the high limit value with a process feedback signal; determining when the process feedback signal may be greater than the DAC output; signaling the PWM generator to change its output to the low level when the process feedback signal may be greater than the DAC output; determining when the output of the PWM generator may change from the high to the low level; starting the blanking timer when the output of the PWM generator may change from the high to the low level; reversing the output of the comparator; selecting a low limit value from a low limit register as the input to the DAC; determining when the blanking timer may have timed out; enabling the output of the comparator when the blanking timer may have timed out for indicating a comparison of the output of the DAC representing the low limit value with the process feedback signal; determining when the process feedback signal may be less than the DAC output; signaling the PWM generator to change its output to the high level when the process feedback signal may be less than the DAC output; and returning to the step of monitoring the output of the PWM generator.

According to a further embodiment of the method, the DAC may be a fast slew rate DAC. According to a further embodiment of the method, the fast slew rate DAC may be a pulse density modulated (PDM) DAC.

According to another embodiment, a method for hysteretic control of a process may comprise the steps of: monitoring a process state and a process feedback signal; determining whether the process state may be on or off; wherein if the process state may be on further comprising the steps of starting a blanking time, selecting a high limit value as an input to a digital-to-analog converter (DAC), comparing the process feedback signal with an output of the DAC representing the high limit value with an analog comparator after the blanking time ends, determining when the process feedback signal may be greater than the DAC output with the analog comparator, and turning the process state off when the process feedback signal may be greater than the DAC output, wherein if the process state may be off further comprising the steps of starting the blank time, selecting a low limit value as the input to the digital-to-analog converter (DAC), comparing the process feedback signal with the output of the DAC representing the low limit value with the analog comparator after the blanking time ends, determining when the process feedback signal may be less than the DAC output with the analog comparator, turning the process state on when the process feedback signal may be less than the DAC output; and returning to the step of determining whether the process state may be on or off.

According to a further embodiment of the method, the DAC may be a fast slew rate DAC. According to a further embodiment of the method, the fast slew rate DAC may be a pulse density modulated (PDM) DAC. According to a further embodiment of the method, the steps of starting the blanking time and ending the blanking time may be done with a blanking timer.

According to yet another embodiment, a method for hysteretic control of a process may comprise the steps of: monitoring a process state; converting a process feedback signal to a digital representation thereof; determining whether the process state may be on or off; wherein if the process state may be on further comprising the steps of starting a blanking time, selecting a high limit digital value as an input to a digital comparator, comparing the digital representation of the process feedback signal to the high limit digital value with a digital comparator after the blanking time ends, determining when the digital representation of the process feedback signal may be greater than the high limit digital value with the digital comparator, and turning the process state off when the digital representation of the process feedback signal may be greater than the high limit digital value, wherein if the process state may be off further comprising the steps of starting the blanking time, selecting a low limit digital value as the input to the digital comparator, comparing the digital representation of the process feedback signal with the low limit digital value after the blanking time ends, determining when the digital representation of the process feedback signal may be less than the low limit digital value, turning the digital representation of the process state on when the process feedback signal may be less than the low limit digital value; and returning to the step of determining whether the process state may be on or off.

According to a further embodiment of the method, the step of converting the process feedback signal to a digital representation thereof may be done with an analog-to-digital converter (ADC). According to a further embodiment of the method, the steps of starting the blanking time and ending the blanking time may be done with a blanking timer.

According to still another embodiment, an apparatus for hysteretic control of a pulse width modulation (PWM) generator may comprise: a digital-to-analog converter (DAC); a digital multiplexer may have a first input coupled to a low limit register, a second input coupled to a high limit register, an output coupled to an input of the DAC, and a control input coupled to an output of the PWM generator; a comparator may have a first input coupled to an output of the DAC and a second input coupled to a sense parameter from an apparatus controlled by the PWM generator; a polarity reversing circuit coupled to an output of the comparator; pulse stretcher and filter logic may have an input coupled to the polarity reversing circuit and an output coupled to a control input of the PWM generator; a blanking gate coupled between an output of the polarity reversing circuit and an input of the pulse stretcher and filter logic; a blanking timer; and an edge detector coupled to the output of the PWM generator and an input of the blanking timer, wherein the edge detector generates a pulse when the output of the PWM generator changes from a low level to a high level, or from the high level to the low level, whereby the blanking timer starts a blanking time; wherein the comparator compares the sense parameter to the DAC output representative of a high limit value stored in the high limit register and coupled to the DAC input when the output of the PWM generator may be high, and the DAC output representative of a low limit value stored in the low limit register and coupled to the DAC input when the output of the PWM generator may be low; whereby when the sense parameter may be greater than the high limit value a signal from the pulse stretcher and filter logic causes the PWM generator output to change from high to low, and when the sense parameter may be less than the low limit value the signal from the pulse stretcher and filter logic causes the PWM generator output to change from low to high.

According to a further embodiment, the digital multiplexer may couple the high limit register to the DAC input when the PWM generator output may be high, and may couple the low limit register to the DAC input when the PWM generator output may be low. According to a further embodiment, a delay circuit may be coupled between the PWM generator output and the control input of the multiplexer. According to a further embodiment, the blanking gate may prevent a logic level change to the pulse stretcher and filter logic until the blanking timer times out. According to a further embodiment, the polarity reversing circuit may reverse the logic polarity of the comparator when the output of the PWM generator may change. According to a further embodiment, the DAC may be a fast slew rate DAC. According to a further embodiment, the fast slew rate DAC may be a pulse density modulated (PDM) DAC.

According to a further embodiment, the PDM DAC may comprise: a pulse density modulation (PDM) generator; a low pass filter coupled to an output of the PDM generator; and a triangle wave generator may have an output coupled to the PDM generator, wherein the output of the PDM generator may be determined by digital values generated by the triangle wave generator. According to a further embodiment, the PDM generator may comprise: an accumulator; an increment register; an adder may have an output coupled to an input of the accumulator, a first input coupled to an output of the increment register, and a second input coupled to an output of the accumulator; and a flip-flop may have an input coupled to a carry output from the adder.

According to a further embodiment, a microcontroller may provide the DAC, the digital multiplexer, the comparator, the polarity reversing circuit, the pulse stretcher and filter logic, the blanking gate, the blanking timer, and the edge detector. According to a further embodiment, the microcontroller may further provide the PWM generator.

According to another embodiment, an apparatus for hysteretic control of a process may comprise: a digital-to-analog converter (DAC); a digital multiplexer may have a first input coupled to a low limit register, a second input coupled to a high limit register, an output coupled to an input of the DAC, and a control input coupled to an output state of the process; a comparator may have a first input coupled to an output of the DAC and a second input coupled to a sense parameter from an apparatus controlled by the process; a polarity reversing circuit coupled to an output of the comparator; pulse stretcher and filter logic may have an input coupled to the polarity reversing circuit and an output adapted to control the process; a blanking gate coupled between an output of the polarity reversing circuit and an input of the pulse stretcher and filter logic; a blanking timer; and an edge detector coupled to and monitoring the process output and an input of the blanking timer, wherein the edge detector generates a pulse when the process output state changes from a low level to a high level, or from the high level to the low level, whereby the blanking timer may start a blanking time; wherein the comparator may compare the sense parameter to the DAC output representative of a high limit value stored in the high limit register and may couple to the DAC input when the output state of the process may be high, and the DAC output representative of a low limit value stored in the low limit register and coupled to the DAC input when the output state of the process may be low; whereby when the sense parameter may be greater than the high limit value a signal from the pulse stretcher and filter logic causes the process state to change from high to low, and when the sense parameter may be less than the low limit value the signal from the pulse stretcher and filter logic may cause the process state to change from low to high.

According to a further embodiment, a microcontroller may provide the DAC, the digital multiplexer, the comparator, the polarity reversing circuit, the pulse stretcher and filter logic, the blanking gate, the blanking timer, and the edge detector.

According to yet another embodiment, an apparatus for hysteretic control of a process may comprise: an analog-to-digital converter (ADC) may have an input coupled to a sense parameter of the process; a digital comparator may have a first input coupled to an output of the ADC; a digital multiplexer may have a first input coupled to a low limit register, a second input may be coupled to a high limit register, an output may be coupled to a second input of the digital comparator, and a control input may be coupled to and monitoring the output state of the process; a polarity reversing circuit may be coupled to an output of the digital comparator; pulse stretcher and filter logic may have an input coupled to the polarity reversing circuit and an output may be adapted to control the process; a blanking gate may be coupled between an output of the polarity reversing circuit and an input of the pulse stretcher and filter logic; a blanking timer; and an edge detector may be coupled to and monitoring the process output and an input of the blanking timer, wherein the edge detector may generate a pulse when the process output state changes from a low level to a high level, or from the high level to the low level, whereby the blanking timer may start a blanking time; wherein the digital comparator may compare the ADC output representative of the sense parameter to a high limit value that may be stored in the high limit register and may be coupled to the ADC input when the output state of the process may be high, and a low limit value stored in the low limit register and may be coupled to the ADC input when the output state of the process may be low; whereby when the sense parameter may be greater than the high limit value a signal from the pulse stretcher and filter logic may cause the process state to change from high to low, and when the sense parameter may be less than the low limit value the signal from the pulse stretcher and filter logic may cause the process state to change from low to high.

According to a further embodiment, a microcontroller may provide the ADC, the digital multiplexer, the digital comparator, the polarity reversing circuit, the pulse stretcher and filter logic, the blanking gate, the blanking timer, and the edge detector.

BRIEF DESCRIPTION OF THE DRAWINGS

A more complete understanding of the present disclosure may be acquired by referring to the following description taken in conjunction with the accompanying drawings wherein.

Figure 1:
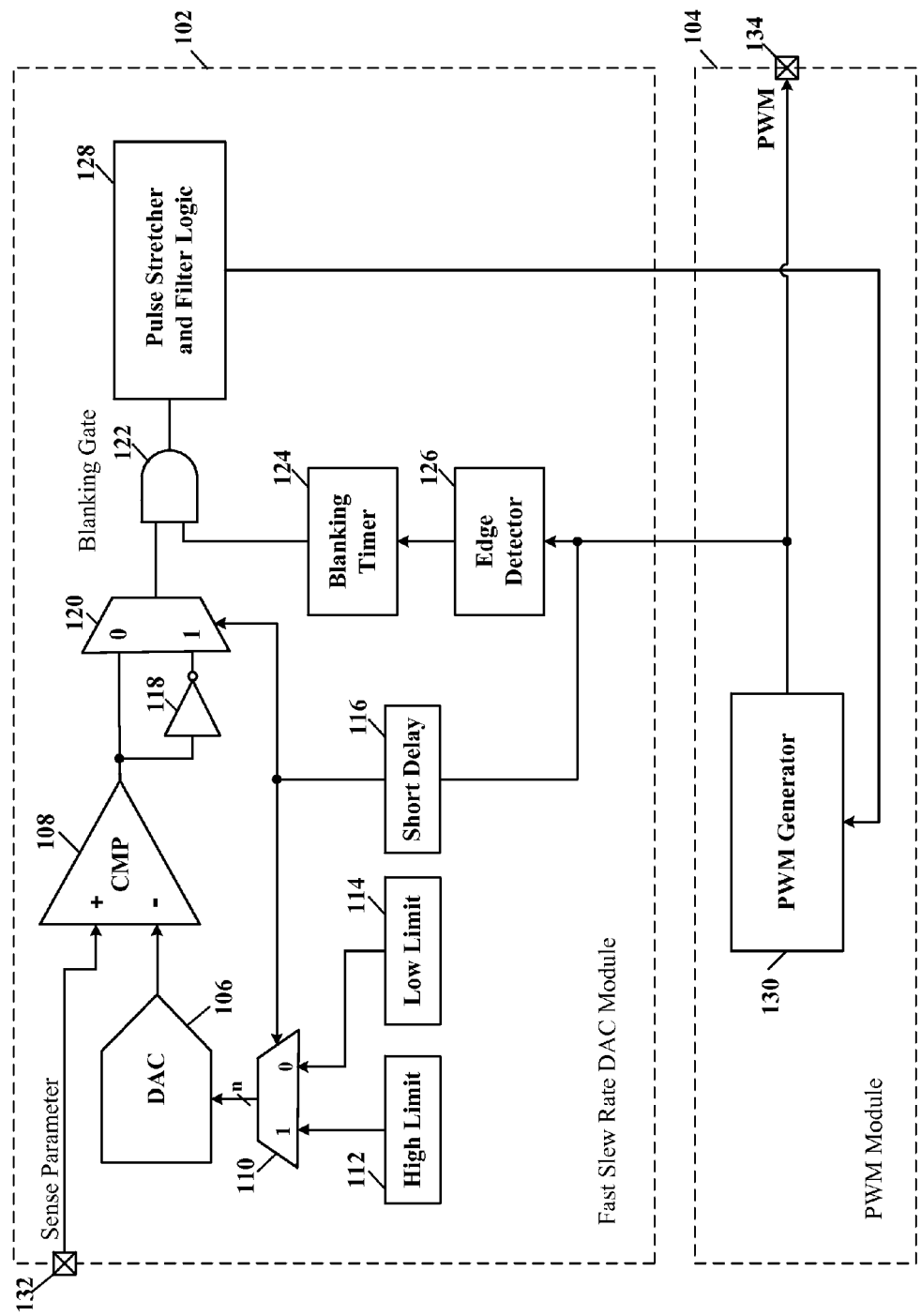
FIG. 1 illustrates a schematic block diagram of a fast-slew-rate digital-to-analog converter (DAC) having a hysteretic control mode, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments of this disclosure, an asymmetric hysteretic controller may be implemented with a single analog input comparator, a fast slew rate digital-to-analog converter (DAC), e.g., a pulse density modulated (PDM) DAC; and some digital control logic. The fast slew rate DAC in combination with the analog input comparator may operate as a sequential windowed comparator having high and low limits. The fast slew rate DAC output races ahead of the observed sense parameter to provide both first and second thresholds that may be used as references to cause the controlled system to operate in either a first or second state. For examples, a thermostat and heating/air conditioning equipment, LED lighting dimmer control, DC/DC power conversion, etc. Furthermore, digital logic may control the fast slew rate DAC and comparator behavior. Selection of high and low process variable limits may occur during blanking periods in order to allow stable comparisons between the high or low limit and the process variable.

According to various embodiments of this disclosure, a hysteretic controller only needs to know when to switch state, e.g., on/off. When the sense parameter (voltage) reaches the fast slew rate DAC specified threshold, the state is reversed. When the hysteretic controller state reversal occurs: (a) the comparator output may be blanked by the control logic, (b) the comparator polarity may be reversed by the control logic, (c) the control logic may command the fast slew rate DAC to transition to the other threshold, (d) the fast slew rate DAC output may "race" ahead of the sense signal, and (e) the comparator output is re-enabled. The aforementioned process steps may continuously repeat.

According to various other embodiments of this disclosure, an asymmetric hysteretic controller may be implemented with an analog-to-digital converter (ADC), a single digital comparator, and some digital control logic. The ADC may convert the analog sense parameter signal into a digital representation thereof and the digital comparator may then compare the digital representation of the sense parameter to digitally stored high or low limits. When the sense parameter (voltage) reaches the selected high or limit, the state is reversed. When the hysteretic controller state reversal occurs: (a) the comparator output may be blanked by the control logic, (b) the comparator polarity may be reversed by the control logic, (c) the control logic may command the other process limit to be selected for comparison with the sense parameter, and (d) the digital comparator output may be re-enabled. The aforementioned process steps may continuously repeat.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a fast-slew-rate digital-to-analog converter (DAC) having a hysteretic control mode, according to a specific example embodiment of this disclosure. A hysteretic controller may comprise a fast slew rate DAC module 102 and a pulse width modulation (PWM) generator 104. The fast slew rate DAC module 102 may comprise an analog input voltage comparator 108, a fast slew rate DAC 106, a first multiplexer 110, a high limit register 112, a low limit register 114, a short time delay circuit 116, an inverter 118, a second multiplexer 120, a blanking gate 122, a blanking timer 124, and edge detector 126, and a pulse stretcher and filer logic 128.

Figure 2:
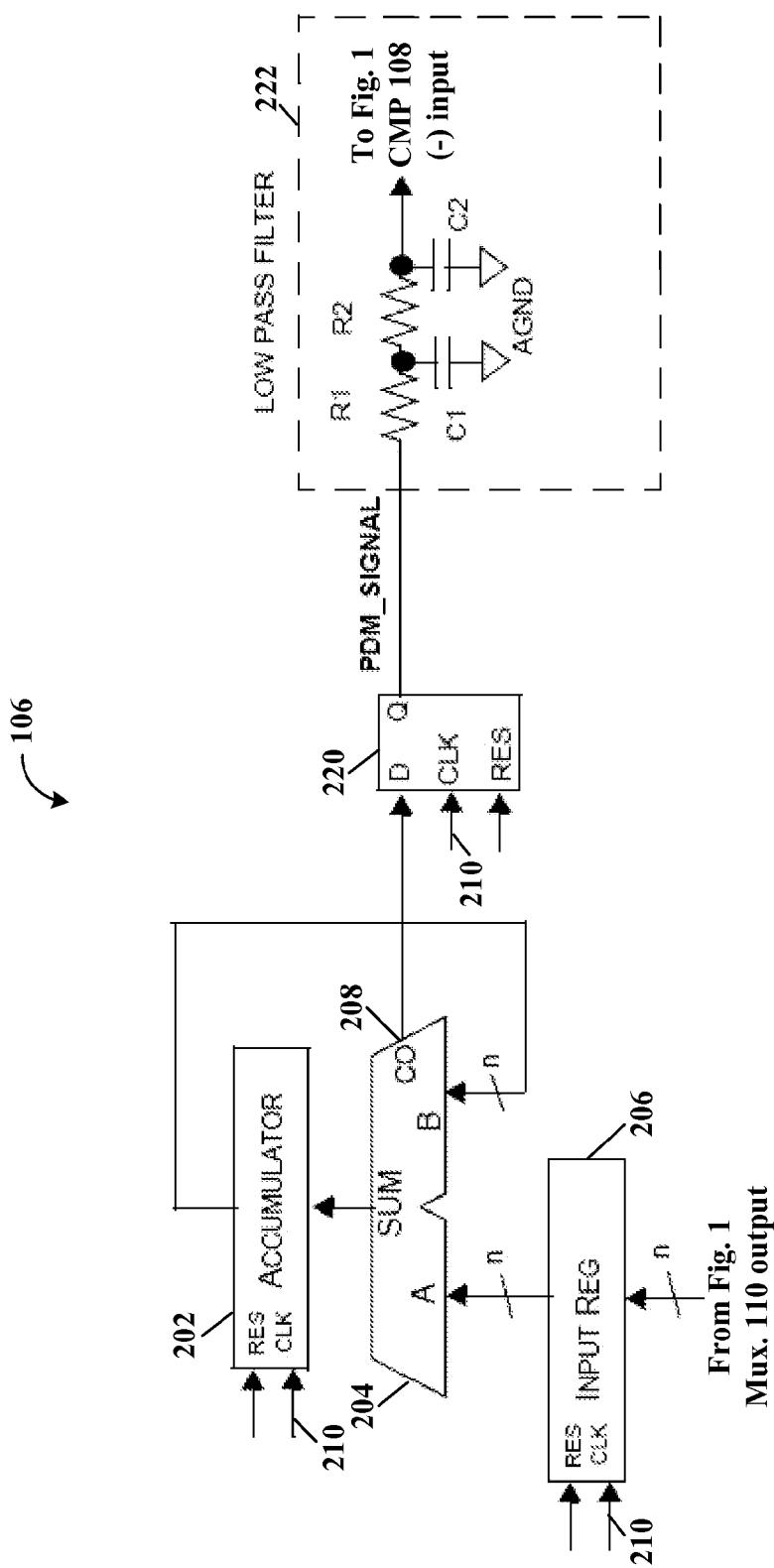
FIG. 2 illustrates a schematic block diagram of a simplified pulse density modulated (PDM) DAC, according to specific example embodiments of this disclosure.

The PWM generator 130 may be controlled by the fast slew rate DAC module 102 as follows: The output from the PWM generator 130 controls a power transistor (not shown) that supplies power to an application circuit (not shown) and this output also controls the initiation of the hysteretic control function as follows: Prior to T=0 (system startup), the application circuit is at rest (off) and PWM output is low (0). The PWM output is driven high to enable power flow through the power transistor (not shown) and thereby begin operation of (turn on) the application circuit (not shown). The edge detector 126 monitors the output signal of the PWM generator 130 and generates an output pulse for each rising or falling edge of the PWM signal. This generated output pulse triggers the blanking timer 124. While the blanking timer 124 is active, the output from the comparator 108 is inhibited by the blanking gate 122. The purpose of the blanking time is to insure that the DAC 106 output has time to settle (RC time constant FIG. 2) before making a comparison between the voltage output from the DAC 106 and the monitored sense parameter voltage at input 132.

The PWM signal may also control the first multiplexer 110 that selects, after a short time delay (short time delay circuit 116) either the output from the low limit register 114 or the high limit register 112 for inputting to the DAC 106. The DAC 106 output voltage then slews (transitions) to the specified voltage determined by the limit value from the selected register 112 or 114. After the specified period of blanking time the DAC 106 will have reached its final output voltage and the output from the analog comparator 108 will no longer be blanked by the blanking gate 122. The monitored sense parameter voltage from the application circuit (typically the output voltage therefrom) rises (because the PWM output enabled power transistor is on) towards the voltage from the DAC 106. When the monitored sense parameter voltage exceeds the voltage from the DAC 106, the output from the comparator 108 will be asserted (e.g., goes high). The asserted output from the comparator 108 will trigger the pulse stretcher and filer logic 128 which then signals the PWM generator 130 to turn its output off. Wherein the power transistor turns off and power stops flowing into the application circuit (goes off).

The falling edge of the PWM output signal causes the edge detector 126 to generate another pulse that again starts the blanking timer 124 to blank the output of the comparator 108. In addition, a low output from the PWM generator 130 causes the second multiplexer 120 to reverse the output polarity of the comparator 108, and the first multiplexer 110 to select, after a short time delay (short time delay circuit 116) the output from the low limit register 114 for inputting to the DAC 106. Thereafter, the DAC output voltage from the DAC 106 slews (transitions) to the specified low voltage. The output from the DAC 106 reaches the specified low voltage before the blanking timer as timed out. When the monitored sense parameter voltage at input 132 drops below the low limit voltage from the DAC 106, the output from the comparator 108 will be de-asserted (e.g., goes low). The de-asserted output from the comparator 108 is inverted with the second multiplexer 120 and will trigger the pulse stretcher and filer logic 128 which then signals the PWM generator 130 to turn its output back on. Wherein the power transistor (not shown) turns on and power begins flowing into the application circuit (goes on). Then the aforementioned cycles repeat. Polarity reversal of the output of the comparator 108 may be optional if the control of the PWM generator is set up for control by two logic levels.

The aforementioned circuit functions, e.g., a fast slew rate DAC module 102 and a pulse width modulation (PWM) generator 104, may be provided in a mixed signal integrated circuit, e.g., a microcontroller, a microprocessor, a digital signal processor, an application specific integrated circuit (ASIC), a programmable logic array (PLA) and the like.

Referring to 2, depicted is a schematic block diagram of a simplified PDM DAC, according to specific example embodiments of this disclosure. A PDM DAC, generally represented by the numerals 106; may comprise an accumulator register 202, an adder (summer) 204, an increment value (DAC value) register 206 that generates overflow carry outputs (CO) 208 at a rate proportional to a value in the increment value register 206 and a D-latch 220. The CO 208 is coupled to the D-input of a latch 220. The Q-output of the D-latch 220 may be coupled to a low pass filter 222, e.g., resistor(s) and capacitor(s) (a two pole RC low pass filter is shown).

The accumulator register 202 and the adder 204 constantly add an increment value from the increment value register 206 to an accumulated sum in the adder 204. For non-zero input values, the accumulated sum will eventually overflow, wherein this overflow may be indicated via the adder 204 "carry out" signal (CO) 208. The rate that the overflow occurs is related to the size of the increment value from the increment value register 206 versus the maximum value that the adder 204 can handle. For example, a 12-bit adder 204 has a maximum output of 0xFFF. If the inputs to the adder 204, the accumulator value and the input value, exceed 0xFFF, then a carry out 208 is generated. The larger the input value, the more frequent the carry out 208 may be generated. The resultant pulses from the carry out 208 pulse stream are then filtered via the low pass filter 222. The resultant analog output voltage from the low pass filter 222 is proportional to the data input increment value from the increment value register 206. The low pass filter 222 may be the dominant "cost" for the complete PDM DAC. Using higher clock rates for the PDM DAC 106 may allow the use of smaller components for the low pass filter 222, thus reducing the module cost, and faster settling time thus increasing the slew or settling rate of the DAC 106. Higher clock rates also support higher conversion speeds making the PDM DAC 106 useable for a wider range of applications. However, the use of higher clock rates will also increase the current consumption of the PDM DAC 106.

It is contemplated and within the scope of this disclosure that any low pass filter circuit design may be used to filter the output of the D-latch 220 and produce an analog voltage signal, and one having ordinary skill in circuit design and the benefit of this disclosure may readily be able to design such a low pass filter circuit. It is also contemplated and within the scope of this disclosure that any fast slew rate DAC may be used as described herein.

Figure 3:
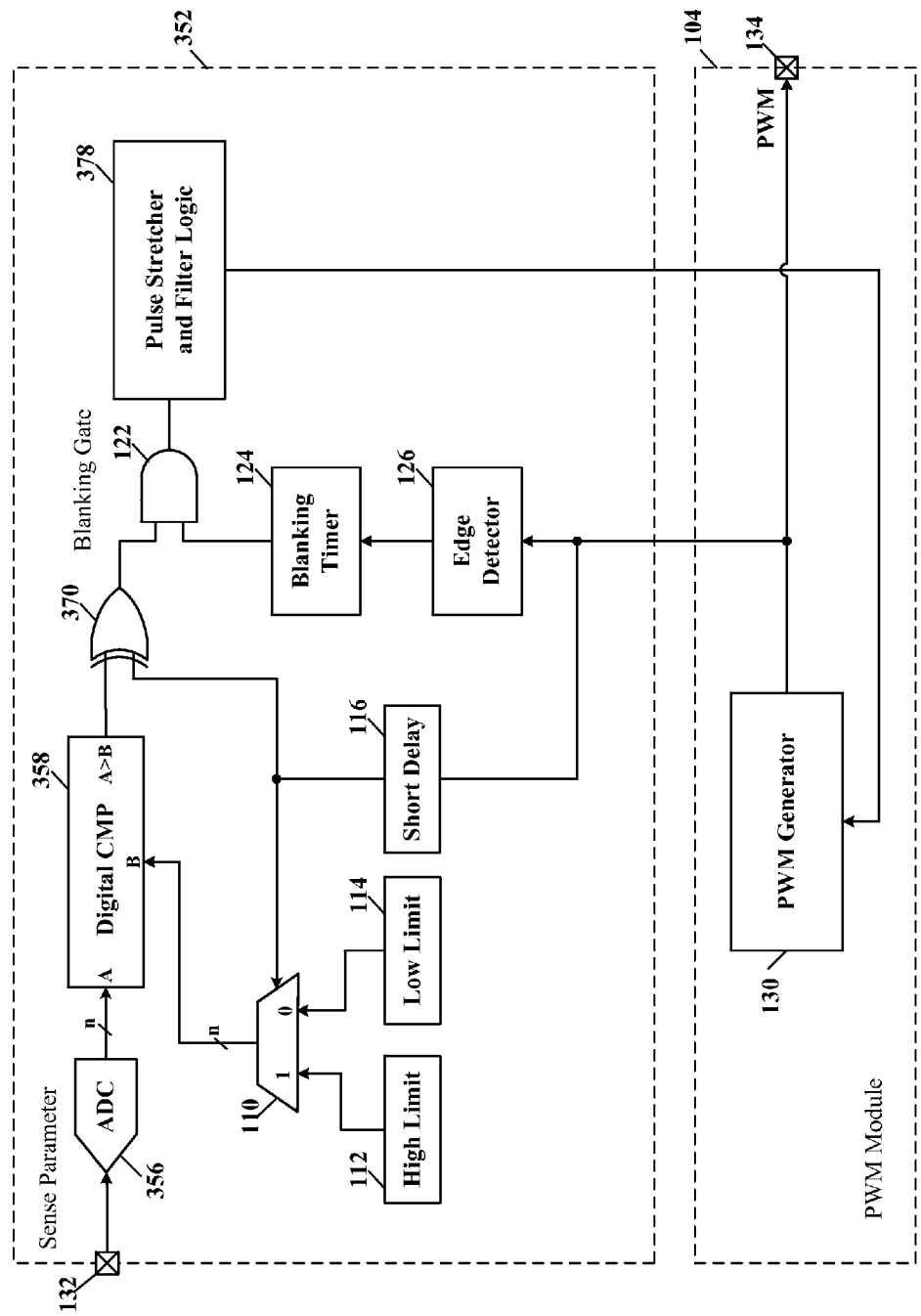
FIG. 3 illustrates a schematic block diagram of an analog-to-digital converter (ADC) having a hysteretic control mode, according to another specific example embodiment of this disclosure.

Referring to FIG. 3, depicted is a schematic block diagram of an analog-to-digital converter (ADC) having a hysteretic control mode, according to another specific example embodiment of this disclosure. A hysteretic controller module 352 may comprise an analog-to-digital converter (ADC) 356, digital comparator 358, a multiplexer 110, a high limit register 112, a low limit register 114, a short time delay circuit 116, an XOR gate 370, a blanking gate 122, a blanking timer 124 and edge detector 126; in combination with a pulse width modulation (PWM) generator 130.

The PWM generator 130 may be controlled by the hysteretic controller module 352 as follows: The output from the PWM generator 130 controls a power transistor (not shown) that supplies power to an application circuit (not shown) and this output also controls the initiation of the hysteretic control function as follows: Prior to T=0 (system startup), the application circuit is at rest (off) and PWM output is low (0). The PWM output is driven high to enable power flow through the power transistor (not shown) and thereby begin operation of (turn on) the application circuit (not shown). The edge detector 126 monitors the output signal of the PWM generator 130 and generates an output pulse for each rising or falling edge of the PWM signal. This generated output pulse triggers the blanking timer 124 having a sufficient time period for all logic circuits of the hysteretic controller module 352 to settle. The ADC 356 continuously converts the analog sense parameter signal to a digital value for input to the digital comparator 358.

The PWM signal may also control the multiplexer 110 that selects, after a short time delay (short time delay circuit 116), either the output from the low limit register 114 or the high limit register 112 for inputting to the digital comparator 358. The digital comparator 358 compares the limit value from the selected register 112 or 114 to the digital representation from the ADC 356 of the analog sense parameter signal. After the specified period of blanking time the digital comparator 358 will have reached a digital comparison between the selected limit value and the digital representation of the analog sense parameter signal. The output from the digital comparator 358 will no longer be blanked by the blanking gate 122. The monitored sense parameter voltage from the application circuit (typically the output voltage therefrom) rises (because the PWM output enabled power transistor is on). When the digital representation of the monitored sense parameter voltage is greater than the high limit value, the output from the digital comparator 358 will be asserted (e.g., goes high). The asserted output from the digital comparator 358 will trigger the pulse stretcher and filer logic 378 which then signals the PWM generator 130 to turn its output off. Wherein the power transistor turns off and power stops flowing into the application circuit (goes off).

The falling edge of the PWM output signal causes the edge detector 126 to generate another pulse that again starts the blanking timer 124 to blank the output of the digital comparator 358. In addition, a low output from the PWM generator 130 causes the XOR gate 370 to reverse the output polarity of the digital comparator 358, and the multiplexer 110 to select, after a short time delay (short time delay circuit 116), the output from the low limit register 114 for inputting to the digital comparator 358. When the digital representation of the monitored sense parameter voltage at input 132 drops below the low limit value the digital comparator 358 output will be de-asserted (e.g., goes low). The de-asserted output from the digital comparator 358 is inverted with the XOR gate 370 and will trigger the pulse stretcher and filer logic 128 which then signals the PWM generator 130 to turn its output back on. Wherein the power transistor (not shown) turns on and power begins flowing into the application circuit (goes on). Then the aforementioned cycles repeat. Polarity reversal of the output of the digital comparator 358 may be optional if control of the PWM generator is set up for two logic levels.

The aforementioned circuit functions, e.g., the ADC and comparator module 352 and a pulse width modulation (PWM) generator 104, may be provided in a mixed signal integrated circuit, e.g., a microcontroller, a microprocessor, a digital signal processor, an application specific integrated circuit (ASIC), a programmable logic array (PLA) and the like.

Figure 4:
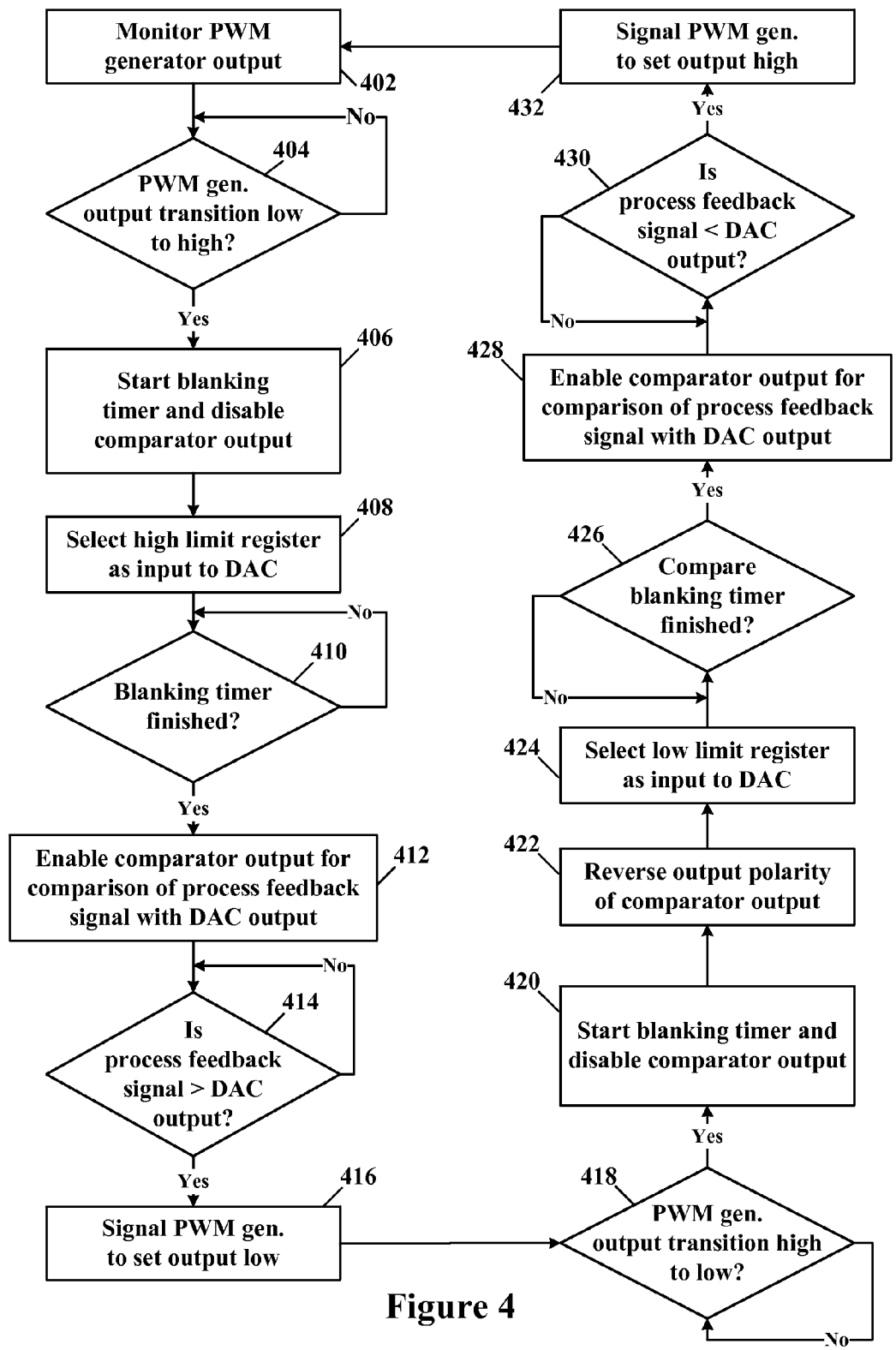
FIG. 4 illustrates a schematic process flow diagram of the operation of a DAC having a hysteretic control mode shown in FIG. 1, according to a specific example embodiment of this disclosure.

Referring to FIG. 4, depicted is a schematic process flow diagram of the operation of a DAC having a hysteretic control mode shown in FIG. 1, according to a specific example embodiment of this disclosure. In step 402 the PWM generator output is monitored. Step 404 determines when the PWM generator output transitions from low to high. In step 406 a blanking timer is started and the comparator output is disabled. In step 408 a high limit register is selected as an input to a DAC. Step 410 determines when the blanking timer is finished (timed out). In step 412 the comparator output is enabled for a comparison of the process feedback signal with the DAC output. Step 414 determines if the process feedback signal is greater than the DAC output. If the process feedback signal is greater than the DAC output, then in step 416 the PWM generator is signaled to set its output low (turns off).

Step 418 determines when the PWM generator output transitions from high to low. In step 420 a blanking timer is started and the comparator output is disabled. In step 422 the output polarity of the comparator is reversed. In step 424 a low limit register is selected as an input to the DAC. Step 426 determines when the blanking timer is finished (timed out). In step 428 the comparator output is enabled for a comparison of the process feedback signal with the DAC output. Step 430 determines if the process feedback signal is less than the DAC output. If the process feedback signal is less than the DAC output, then in step 432 the PWM generator is signaled to set its output high (turn on), and return to step 402.

Figure 5:
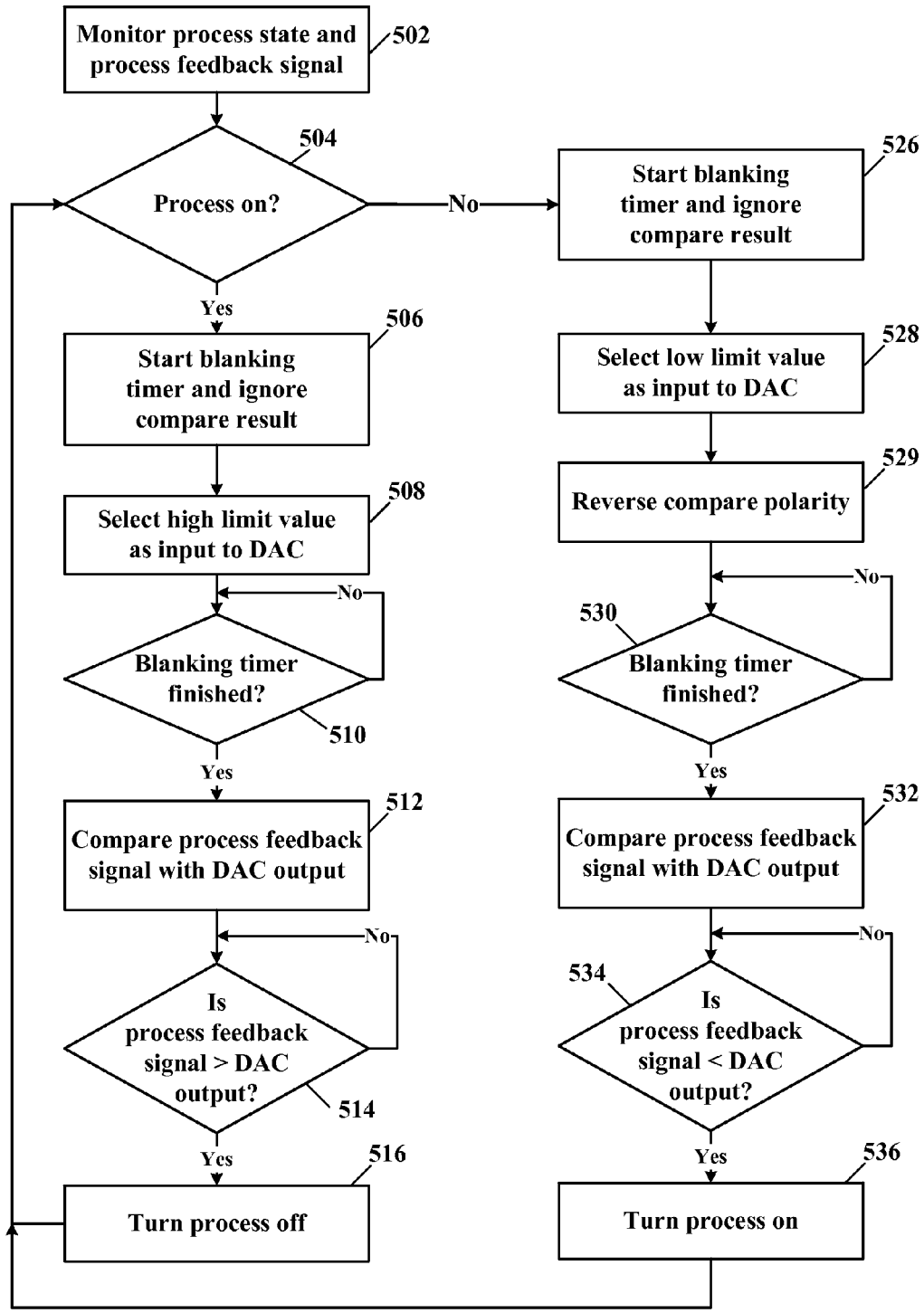
FIG. 5 illustrates a schematic process flow diagram of the operation of a DAC having a hysteretic control mode shown in FIG. 1, according to another specific example embodiment of this disclosure.

Referring to FIG. 5, depicted is a schematic process flow diagram of the operation of a DAC having a hysteretic control mode shown in FIG. 1, according to another specific example embodiment of this disclosure. In step 502 the process state and process feedback signal are monitored. Step 504 determines whether the process is on or off. If the process is on, then in step 506 a blanking timer is started and a compare result is ignored. In step 508 a high limit value is selected as an input to a DAC. Step 510 determines when the blanking timer is finished (timed out). In step 512 a comparison is made between the process feedback signal and the DAC output determined by the high limit. Step 514 determines if the process feedback signal is greater than the DAC output. If the process feedback signal is greater than the DAC output then in step 516 the process is turned off, and return to step 504.

If the process is off, then in step 526 the blanking timer is started and a compare result is ignored. In step 528 a low limit value is selected as an input to a DAC. In step 529 the comparison polarity is reversed. Step 530 determines when the blanking timer is finished (timed out). In step 532 a comparison is made between the process feedback signal and the DAC output determined by the low limit value. Step 534 determines if the process feedback signal is less than the DAC output. If the process feedback signal is less than the DAC output then in step 536 the process is turned on, and return to step 504.

Figure 6:
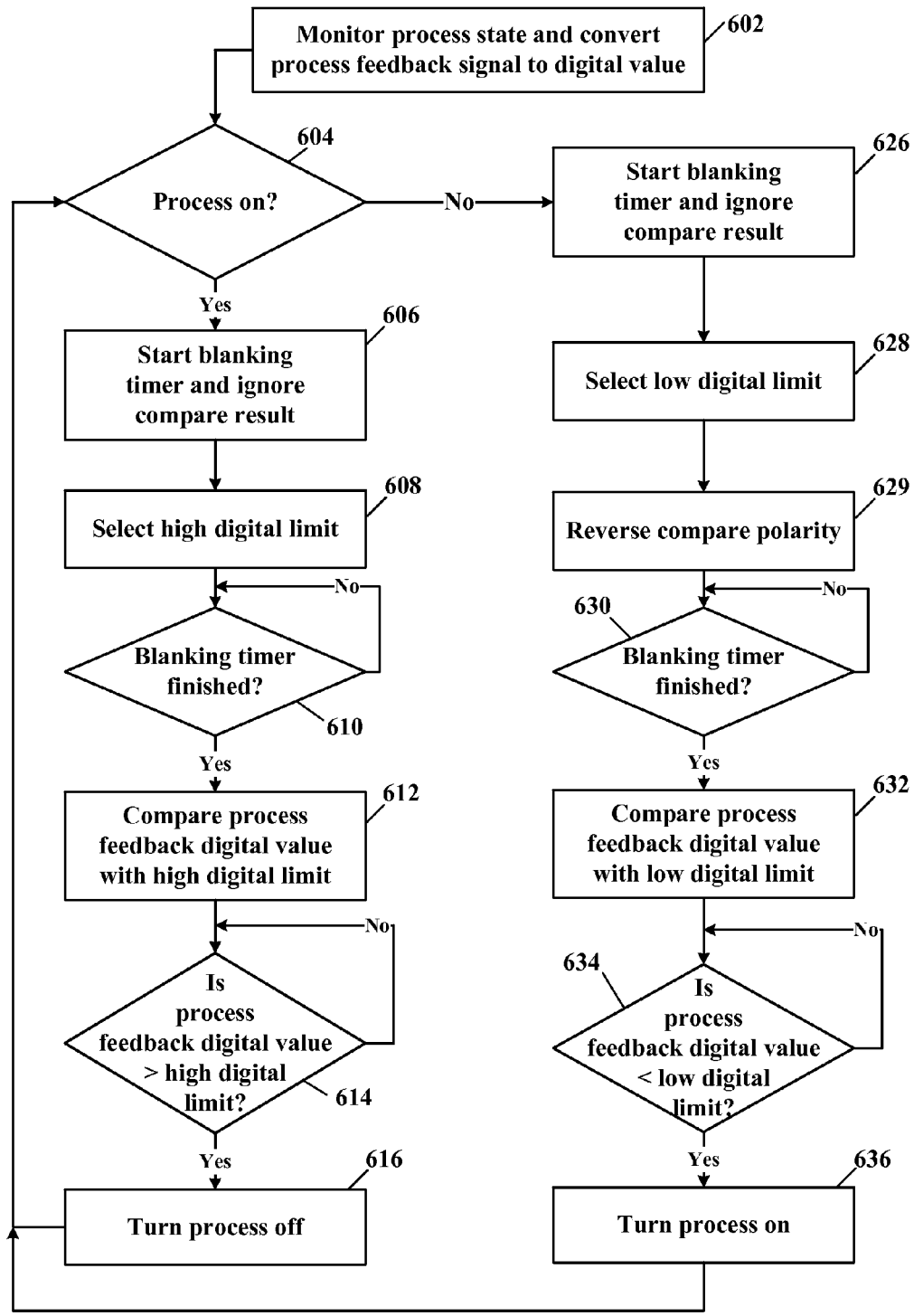
FIG. 6 illustrates a schematic process flow diagram of the operation of an ADC having a hysteretic control mode shown in FIG. 3, according to yet another specific example embodiment of this disclosure.

Referring to FIG. 6, depicted is a schematic process flow diagram of the operation of an ADC having a hysteretic control mode shown in FIG. 3, according to yet another specific example embodiment of this disclosure. In step 602 the process state and a digital conversion of the process feedback signal are monitored. Step 604 determines whether the process is on or off. If the process is on, then in step 606 a blanking timer is started and a compare result is ignored. In step 608 a high digital limit is selected as an input to a digital comparator. Step 610 determines when the blanking timer is finished (timed out). In step 612 a comparison is made between the process feedback digital value and the high digital limit with the digital comparator. Step 614 determines if the process feedback digital value is greater than the high digital limit. If the process feedback signal is greater than the high digital limit then in step 616 the process is turned off, and return to step 604.

If the process is off, then in step 626 the blanking timer is started and a compare result is ignored. In step 628 a low digital limit is selected as an input to the digital comparator. In step 629 the comparison polarity is reversed. Step 630 determines when the blanking timer is finished (timed out). In step 632 a comparison is made between the process feedback digital value and the low digital limit with the digital comparator. Step 634 determines if the process feedback signal is less than the low digital limit. If the process feedback signal is less than the low digital limit then in step 636 the process is turned on, and return to step 604.

Additional background information on a PDM DAC is more fully disclosed in commonly owned U.S. patent application Ser. No. 14/202,420; filed Mar. 10, 2014; entitled "Pulse Density Digital-to-Analog Converter with Slope Compensation Function," by Bryan Kris, Andreas Reiter and Tibor Futo; and is hereby incorporated by reference herein for all purposes.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

The invention claimed is:

1. A method for hysteretic control of a pulse width modulation (PWM) generator, said method comprising the steps of:
monitoring an output of a PWM generator;
determining when the output of the PWM generator changes from a low to a high level;
starting a blanking timer when the output of the PWM generator changes from the low to the high level;
selecting a high limit value from a high limit register as an input to a digital-to-analog converter (DAC);
determining when the blanking timer has timed out;
enabling an output of a comparator when the blanking timer has timed out for indicating a comparison of an output of the DAC representing the high limit value with a process feedback signal;
determining when the process feedback signal is greater than the DAC output;
signaling the PWM generator to change its output to the low level when the process feedback signal is greater than the DAC output;
determining when the output of the PWM generator changes from the high to the low level;
starting the blanking timer when the output of the PWM generator changes from the high to the low level;
reversing the output of the comparator;
selecting a low limit value from a low limit register as the input to the DAC;
determining when the blanking timer has timed out;
enabling the output of the comparator when the blanking timer has timed out for indicating a comparison of the output of the DAC representing the low limit value with the process feedback signal;
determining when the process feedback signal is less than the DAC output;
signaling the PWM generator to change its output to the high level when the process feedback signal is less than the DAC output; and
returning to the step of monitoring the output of the PWM generator.

2. The method according to claim 1, wherein the DAC is a fast slew rate DAC.

3. The method according to claim 2, wherein the fast slew rate DAC is a pulse density modulated (PDM) DAC.

4. A method for hysteretic control of a process, said method comprising the steps of:
monitoring a process state and a process feedback signal;
determining whether the process state is on or off;
wherein if the process state is on further comprising the steps of
starting a blanking time,
selecting a high limit value as an input to a digital-to-analog converter (DAC),
comparing the process feedback signal with an output of the DAC representing the high limit value with an analog comparator after the blanking time ends,
determining when the process feedback signal is greater than the DAC output with the analog comparator, and
turning the process state off when the process feedback signal is greater than the DAC output,
wherein if the process state is off further comprising the steps of
starting the blank time,
selecting a low limit value as the input to the digital-to-analog converter (DAC),
comparing the process feedback signal with the output of the DAC representing the low limit value with the analog comparator after the blanking time ends,
determining when the process feedback signal is less than the DAC output with the analog comparator,
turning the process state on when the process feedback signal is less than the DAC output; and
returning to the step of determining whether the process state is on or off.

5. The method according to claim 4, wherein the DAC is a fast slew rate DAC.

6. The method according to claim 5, wherein the fast slew rate DAC is a pulse density modulated (PDM) DAC.

7. The method according to claim 4, wherein the steps of starting the blanking time and ending the blanking time are done with a blanking timer.

8. A method for hysteretic control of a process, said method comprising the steps of:
monitoring a process state;
converting a process feedback signal to a digital representation thereof;
determining whether the process state is on or off;
wherein if the process state is on further comprising the steps of
starting a blanking time,
selecting a high limit digital value as an input to a digital comparator,
comparing the digital representation of the process feedback signal to the high limit digital value with a digital comparator after the blanking time ends,
determining when the digital representation of the process feedback signal is greater than the high limit digital value with the digital comparator, and
turning the process state off when the digital representation of the process feedback signal is greater than the high limit digital value,
wherein if the process state is off further comprising the steps of
starting the blanking time,
selecting a low limit digital value as the input to the digital comparator,
comparing the digital representation of the process feedback signal with the low limit digital value after the blanking time ends,
determining when the digital representation of the process feedback signal is less than the low limit digital value,
turning the digital representation of the process state on when the process feedback signal is less than the low limit digital value; and returning to the step of determining whether the process state is on or off.

9. The method according to claim 8, wherein the step of converting the process feedback signal to a digital representation thereof is done with an analog-to-digital converter (ADC).

10. The method according to claim 8, wherein the steps of starting the blanking time and ending the blanking time are done with a blanking timer.

11. An apparatus for hysteretic control of a pulse width modulation (PWM) generator, comprising:
a digital-to-analog converter (DAC);
a digital multiplexer having a first input coupled to a low limit register, a second input coupled to a high limit register, an output coupled to an input of the DAC, and a control input coupled to an output of the PWM generator;
a comparator having a first input coupled to an output of the DAC and a second input coupled to a sense parameter from an apparatus controlled by the PWM generator;
a polarity reversing circuit coupled to an output of the comparator;
pulse stretcher and filter logic having an input coupled to the polarity reversing circuit and an output coupled to a control input of the PWM generator;
a blanking gate coupled between an output of the polarity reversing circuit and an input of the pulse stretcher and filter logic;
a blanking timer; and
an edge detector coupled to the output of the PWM generator and an input of the blanking timer, wherein the edge detector generates a pulse when the output of the PWM generator changes from a low level to a high level, or from the high level to the low level, whereby the blanking timer starts a blanking time;
wherein the comparator compares the sense parameter to the DAC output representative of a high limit value stored in the high limit register and coupled to the DAC input when the output of the PWM generator is high, and the DAC output representative of a low limit value stored in the low limit register and coupled to the DAC input when the output of the PWM generator is low;
whereby when the sense parameter is greater than the high limit value a signal from the pulse stretcher and filter logic causes the PWM generator output to change from high to low, and when the sense parameter is less than the low limit value the signal from the pulse stretcher and filter logic causes the PWM generator output to change from low to high.

12. The apparatus according to claim 11, wherein the digital multiplexer couples the high limit register to the DAC input when the PWM generator output is high, and couples the low limit register to the DAC input when the PWM generator output is low.

13. The apparatus according to claim 11, further comprising a delay circuit coupled between the PWM generator output and the control input of the multiplexer.

14. The apparatus according to claim 11, wherein the blanking gate prevents a logic level change to the pulse stretcher and filter logic until the blanking timer times out.

15. The apparatus according to claim 11, wherein the polarity reversing circuit reverses the logic polarity of the comparator when the output of the PWM generator changes.

16. The apparatus according to claim 11, wherein the DAC is a fast slew rate DAC.

17. The apparatus according to claim 16, wherein the fast slew rate DAC is a pulse density modulated (PDM) DAC.

18. The apparatus according to claim 11, wherein the PDM DAC comprises:
a pulse density modulation (PDM) generator;
a low pass filter coupled to an output of the PDM generator; and
a triangle wave generator having an output coupled to the PDM generator, wherein the output of the PDM generator is determined by digital values generated by the triangle wave generator.

19. The apparatus according to claim 18, wherein the PDM generator comprises:
an accumulator;
an increment register;
an adder having an output coupled to an input of the accumulator, a first input coupled to an output of the increment register, and a second input coupled to an output of the accumulator; and
a flip-flop having an input coupled to a carry output from the adder.

20. The apparatus according to claim 11, wherein a microcontroller may provide the DAC, the digital multiplexer, the comparator, the polarity reversing circuit, the pulse stretcher and filter logic, the blanking gate, the blanking timer, and the edge detector.

21. The apparatus according to claim 20, wherein the microcontroller may further provide the PWM generator.

22. An apparatus for hysteretic control of a process, comprising:
a digital-to-analog converter (DAC);
a digital multiplexer having a first input coupled to a low limit register, a second input coupled to a high limit register, an output coupled to an input of the DAC, and a control input coupled to an output state of the process;
a comparator having a first input coupled to an output of the DAC and a second input coupled to a sense parameter from an apparatus controlled by the process;
a polarity reversing circuit coupled to an output of the comparator;
pulse stretcher and filter logic having an input coupled to the polarity reversing circuit and an output adapted to control the process;
a blanking gate coupled between an output of the polarity reversing circuit and an input of the pulse stretcher and filter logic;
a blanking timer; and
an edge detector coupled to and monitoring the process output and an input of the blanking timer, wherein the edge detector generates a pulse when the process output state changes from a low level to a high level, or from the high level to the low level, whereby the blanking timer starts a blanking time;
wherein the comparator compares the sense parameter to the DAC output representative of a high limit value stored in the high limit register and coupled to the DAC input when the output state of the process is high, and the DAC output representative of a low limit value stored in the low limit register and coupled to the DAC input when the output state of the process is low;
whereby when the sense parameter is greater than the high limit value a signal from the pulse stretcher and filter logic causes the process state to change from high to low, and when the sense parameter is less than the low limit value the signal from the pulse stretcher and filter logic causes the process state to change from low to high.

23. The apparatus according to claim 22, wherein a microcontroller may provide the DAC, the digital multiplexer, the comparator, the polarity reversing circuit, the pulse stretcher and filter logic, the blanking gate, the blanking timer, and the edge detector.

24. An apparatus for hysteretic control of a process, comprising:
- an analog-to-digital converter (ADC) having an input coupled to a sense parameter of the process;
- a digital comparator having a first input coupled to an output of the ADC;
- a digital multiplexer having a first input coupled to a low limit register, a second input coupled to a high limit register, an output coupled to a second input of the digital comparator, and a control input coupled to and monitoring the output state of the process;
- a polarity reversing circuit coupled to an output of the digital comparator;
- pulse stretcher and filter logic having an input coupled to the polarity reversing circuit and an output adapted to control the process;
- a blanking gate coupled between an output of the polarity reversing circuit and an input of the pulse stretcher and filter logic;
- a blanking timer; and
- an edge detector coupled to and monitoring the process output and an input of the blanking timer, wherein the edge detector generates a pulse when the process output state changes from a low level to a high level, or from the high level to the low level, whereby the blanking timer starts a blanking time;
- wherein the digital comparator compares the ADC output representative of the sense parameter to a high limit value stored in the high limit register and coupled to the ADC input when the output state of the process is high, and a low limit value stored in the low limit register and coupled to the ADC input when the output state of the process is low;
- whereby when the sense parameter is greater than the high limit value a signal from the pulse stretcher and filter logic causes the process state to change from high to low, and when the sense parameter is less than the low limit value the signal from the pulse stretcher and filter logic causes the process state to change from low to high.

25. The apparatus according to claim 24, wherein a microcontroller may provide the ADC, the digital multiplexer, the digital comparator, the polarity reversing circuit, the pulse stretcher and filter logic, the blanking gate, the blanking timer, and the edge detector.

* * * * *